(12) United States Patent
Ler et al.

(10) Patent No.: US 9,502,168 B1
(45) Date of Patent: Nov. 22, 2016

(54) INTERLEAVED T-COIL STRUCTURE AND A METHOD OF MANUFACTURING THE T-COIL STRUCTURE

(71) Applicant: Altera Corporation, San Jose, CA (US)

(72) Inventors: Chun Lee Ler, Tangkak (MY); Shuxian Chen, Fremont, CA (US)

(73) Assignee: Altera Corporation, San Jose, CA (US)

( * ) Notice: Subject to any disclaimer, the term of this patent is extended or adjusted under 35 U.S.C. 154(b) by 102 days.

(21) Appl. No.: 14/081,970

(22) Filed: Nov. 15, 2013

(51) Int. Cl.
*H01F 5/00* (2006.01)
*H01F 27/28* (2006.01)
*H01F 41/04* (2006.01)

(52) U.S. Cl.
CPC ........ *H01F 27/2804* (2013.01); *H01F 41/041* (2013.01)

(58) Field of Classification Search
CPC .................................. H01F 5/00; H01F 27/28
USPC .................................................. 336/200, 232
See application file for complete search history.

(56) References Cited

U.S. PATENT DOCUMENTS

| | | | |
|---|---|---|---|
| 2,549,825 A | 4/1951 | Emile | |
| 4,626,816 A | 12/1986 | Blumkin et al. | |
| 4,959,631 A * | 9/1990 | Hasegawa | H01F 17/0006 336/180 |
| 5,610,433 A | 3/1997 | Merrill et al. | |
| 6,339,320 B1 | 1/2002 | Spremo et al. | |
| 6,801,114 B2 | 10/2004 | Yang et al. | |
| 7,135,951 B1 | 11/2006 | Sidhu | |
| 7,187,174 B2 | 3/2007 | Iwadate et al. | |
| 7,663,463 B2 | 2/2010 | Lin et al. | |
| 7,768,372 B2 | 8/2010 | Gianesello | |
| 8,068,003 B2 | 11/2011 | Chen et al. | |
| 8,159,044 B1 | 4/2012 | Chen et al. | |
| 2001/0022019 A1 | 9/2001 | Ahn et al. | |
| 2001/0035809 A1 | 11/2001 | Goff | |
| 2003/0071706 A1 | 4/2003 | Christensen | |
| 2003/0137383 A1 | 7/2003 | Yang et al. | |
| 2004/0017278 A1 | 1/2004 | Castaneda et al. | |
| 2006/0038635 A1 * | 2/2006 | Richiuso | H01F 17/0006 333/177 |

(Continued)

FOREIGN PATENT DOCUMENTS

JP  06013239 A  *  1/1994

OTHER PUBLICATIONS

Galal et al., "Broadband ESD Protection Circuits in CMOS Technology", IEEE Journal of Solid-State Circuits, vol. 38, No. 12, Dec. 2003.
Kossel et al., "A T-Coli-Enhanced 8.5 Gb/s High-Swing SST Transmitter in 65 nm Bulk CMOS With < -16dB Return Loss Over 10GHz Bandwidth", IEEE Journal of Solid-State Circuits, vol. 43, No. 12, Dec. 2008.
Geen et al., "Miniature Multilayer Spiral Inductors for GaAs MMICs," GaAs IC Symposium, 1989.

*Primary Examiner* — Tsz Chan

(57) ABSTRACT

In one embodiment, an integrated circuit is described. The integrated circuit includes a substrate, a dielectric stack, a first inductor and a second inductor. The dielectric stack may be formed above the substrate and includes first and second layers. The first inductor may be formed in both the first and second layers. The second inductor may also be formed in the first and second layers with a substantial portion of the first inductor structure overlaps with the second inductor structure.

18 Claims, 6 Drawing Sheets

(56) References Cited

U.S. PATENT DOCUMENTS

| | | | |
|---|---|---|---|
| 2006/0077028 A1* | 4/2006 | Huang | H01F 17/0006 336/223 |
| 2006/0284718 A1* | 12/2006 | Baumgartner | H01F 17/0006 336/223 |
| 2007/0247269 A1 | 10/2007 | Papananos | |
| 2007/0267718 A1 | 11/2007 | Lee | |
| 2009/0039916 A1* | 2/2009 | Buchmann | G11C 5/066 326/38 |
| 2009/0261453 A1 | 10/2009 | Matz et al. | |
| 2010/0193904 A1 | 8/2010 | Watt et al. | |
| 2011/0248811 A1* | 10/2011 | Kireev | H01L 23/5227 336/200 |
| 2014/0266434 A1* | 9/2014 | Kireev | H03F 3/04 330/250 |

* cited by examiner

INTERLEAVED T-COIL STRUCTURE AND A METHOD OF MANUFACTURING THE T-COIL STRUCTURE

BACKGROUND

High-speed input/output (I/O) circuits require proper impedance matching between an off-chip circuit and on-chip circuitry to ensure efficient power transfer and signal integrity. In order to obtain good impedance matching between the off-chip circuit and the on-chip circuitry such as an on-chip I/O circuit, the impedance of the on-chip circuitry should match as closely as possible to the impedance of the transmission line between the on-chip circuitry and the off-chip circuit.

The parasitic capacitance in an on-chip circuit, however, may adversely affect the impedance matching between the off-chip circuit and the on-chip circuit (e.g., an on-chip I/O circuit). As an example, the parasitic capacitance in an on-chip I/O circuit may be contributed by an electrostatic discharge (ESD) protection circuit within the I/O circuit.

Generally, impedance matching techniques may include, among others, coupling an on-chip termination resistor to the affected I/O circuit, and including a T-coil circuit (either symmetrical or asymmetrical) in the on-chip circuitry. Conventional T-coil circuit structures, however, may not provide a good magnetic coupling factor and may be effective only at relatively low resonant frequencies.

It is within this context that the embodiments described herein arise.

SUMMARY

Embodiments described herein include an interleaved T-coil structure and a method of manufacturing the T-coil structure. A T-coil structure is a type of inductor structure that is formed within an integrated circuit device. It should be appreciated that the embodiments can be implemented in numerous ways, such as a process, an apparatus, a system, a device, or a method. Several embodiments are described below.

In one embodiment, a T-coil structure is provided. The T-coil structure may be an asymmetric structure that includes first and second inductors formed by its respective conductive paths. The conductive paths may be arranged in an interleaved formation. Within the T-coil structure, there may be magnetic coupling between the first and second inductors in two directions (e.g., vertical and horizontal directions). The interleaving between the conductive paths of the first and second inductors may also form a capacitor in the T-coil structure. The T-coil structure may provide relatively more design options compared to conventional T-coil structures. For example, the magnetic coupling factor of the T-coil circuit may be changed by adjusting the spacing between a conductive path of the first inductor and a conductive path of the second inductor when designing the T-coil structure.

In one embodiment, an integrated circuit is disclosed. The integrated circuit includes a substrate, a dielectric stack, a first inductor and a second inductor. The dielectric stack may be formed above the substrate and may include first and second interconnect layers. The first inductor may be formed in both the first and second interconnect layers. The second inductor may also be formed in the first and second interconnect layers such that a substantial portion of the first inductor structure overlaps with the second inductor structure.

In another embodiment, another integrated circuit is disclosed. The integrated circuit includes a first inductor structure and a second inductor structure. The first inductor structure may be formed in first and second interconnect layers. The first inductor structure may be formed from first conductive paths having a first width. The second inductor structure, on the other hand, may be formed in the first and second interconnect layers and may include second conductive paths having a second width. The first width is different than the second width.

In an alternative embodiment, a method of manufacturing a circuit is disclosed. The method includes forming a portion of a first inductor structure on a first interconnect layer. The method further includes forming a portion of a second inductor structure, parallel to the first inductor structure, on the first interconnect layer. Finally, the method includes forming another portion of a second inductor structure on a second interconnect layer. In one instance, the portion of the first inductor structure substantially overlaps with the portion of second inductor structure in the first interconnect layer and the another portion of the second inductor structure in the second interconnect layer.

Further features of the invention, its nature and various advantages will be more apparent from the accompanying drawings and the following detailed description of the preferred embodiments.

DETAILED DESCRIPTION

The following embodiments describe an interleaved T-coil structure and a method of manufacturing the interleaved T-coil structure. It will be obvious, however, to one skilled in the art, that the present exemplary embodiments may be practiced without some or all of these specific details. In other instances, well-known operations have not been described in detail in order not to unnecessarily obscure the present embodiments.

Figure 1:
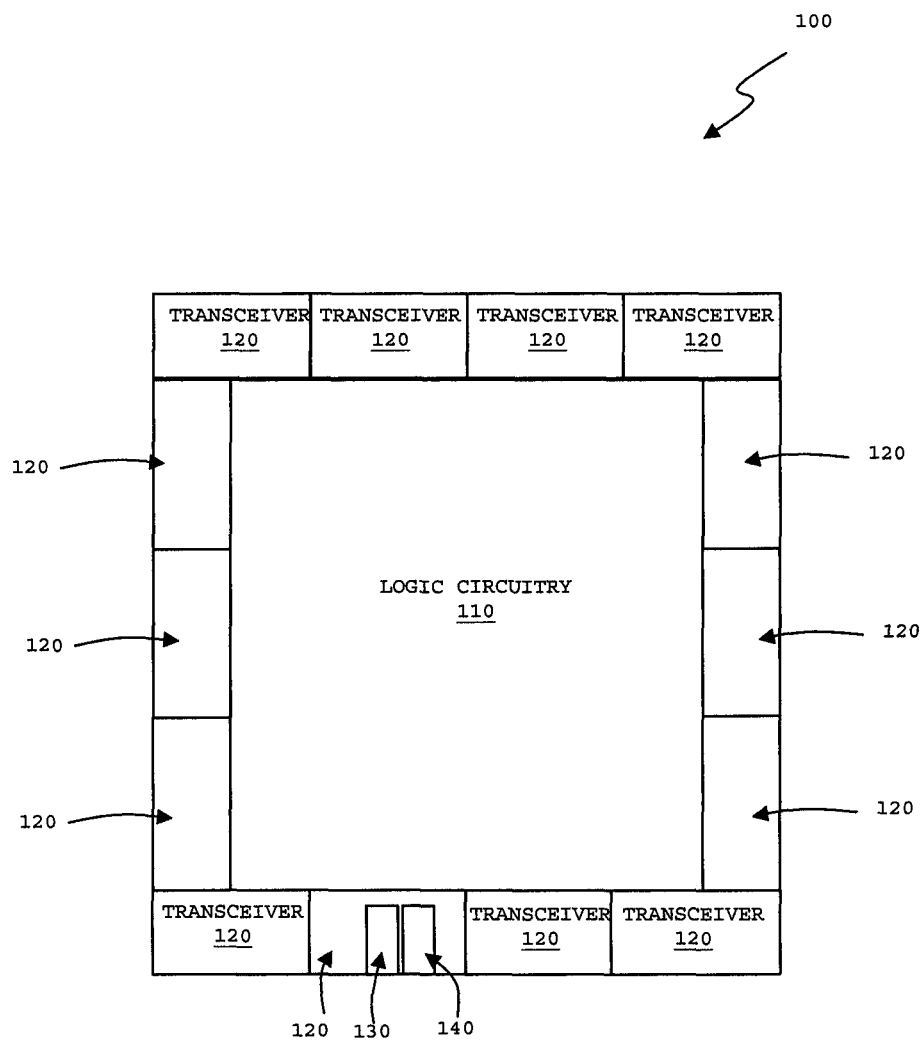
FIG. 1 shows an illustrative integrated circuit in accordance with one embodiment of the present invention.

FIG. 1, meant to be illustrative and not limiting, shows an integrated circuit in accordance with one embodiment of the present invention. Integrated circuit 100 may be an application specific integrated circuit (ASIC), an application standard specific product (ASSP) or a programmable logic device (PLD). It should be appreciated that ASIC and ASSP devices may perform a fixed and dedicated function whereas a PLD device may be programmable to perform various functions. An example of a PLD device may be a field programmable gate array (FPGA) device.

Integrated circuit 100 may form a part of a wireless system, a wired system, etc. Therefore, integrated circuit 100 may include circuits dedicated to perform various functions that define the system. In one embodiment, integrated circuit 100 may be a network controller device. The network controller device may be utilized for managing data transfer between network nodes (e.g., between network servers).

Integrated circuit 100 may include logic circuitry 110 and a plurality of transceivers 120. In FIG. 1, the plurality of transceivers 120 are in the peripheral portion of integrated circuit 100 and logic circuitry 100 is in the middle portion of integrated circuit 100. However, it should be appreciated that the arrangement of transceivers 120 and logic circuitry 110 on integrated circuit 100 may vary depending on requirements of a particular design.

Logic circuitry 110 may be utilized for performing core functions of integrated circuit 100. It should be appreciated that logic circuitry 110 may include circuits specific to the functions that define integrated circuit 100. For example, logic circuitry 110 may include circuits to perform memory device addressing and processing of information retrieved from a memory device when integrated circuit 100 is used as a memory controller. In another example, logic circuitry 110 may include programmable logic elements when integrated circuit 100 is a PLD. The programmable logic elements may further include well-known elements and circuits such as look-up table circuitry, multiplexers, product-term logic, registers, memory and the like, the details of which are not described herein in order not to unnecessarily obscure the present invention. The programmable logic elements may be programmed by a user to perform any desired function.

A signal from logic circuitry 110 may be transferred out of integrated circuit 100 though one of the plurality of transceivers 120. Similarly, a signal received by integrated circuit 100 from an external device (a device located external to integrated circuit 100) may be transferred in to logic circuitry 110 through one of the plurality of transceivers 120. Therefore, transceivers 120 may be known as external interfacing circuitry of integrated circuit 100. In one embodiment, transceiver 120 may transfer signals at speeds of greater than 20 Gigabits per second (Gbps). Transferring signals at such speed may require a matching impedance between a circuit on integrated circuit 100 and a signal pathway that is coupled to the circuit. Having a matching impedance between the circuit and the signal pathway may provide a signal transmission with a relatively low return loss ($R_L$). In one instance, the return loss may be less than −10 decibel (dB) when the circuit and the signal pathway have matching impedances. Furthermore, the return loss may be less than −10 dB across a large bandwidth (e.g., across a range of approximately 10 Giga Hertz (GHz)).

Figure 2:
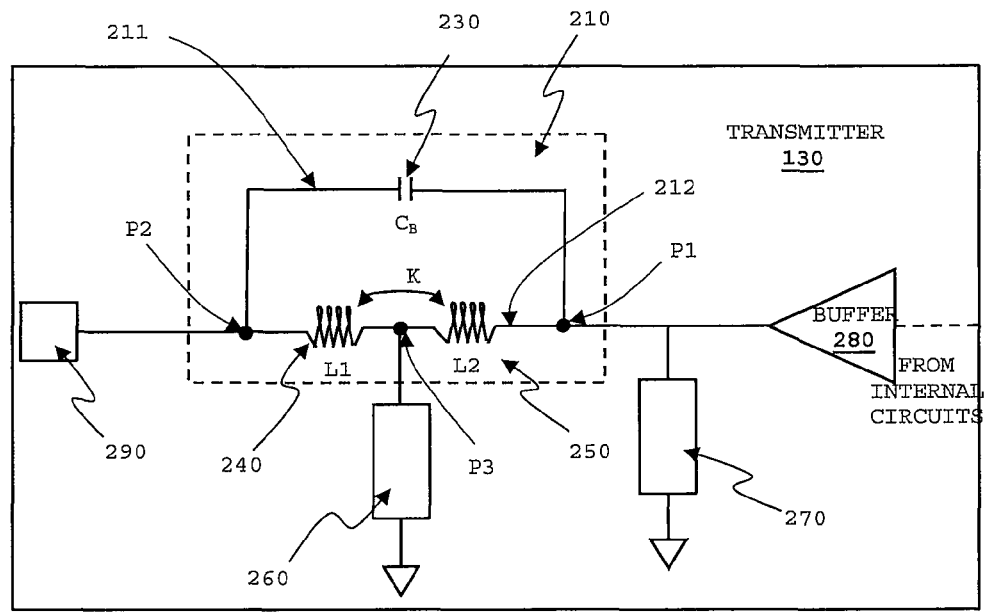
FIG. 2 shows an illustrative transmitter circuit in accordance with one embodiment of the present invention.
Figure 3:
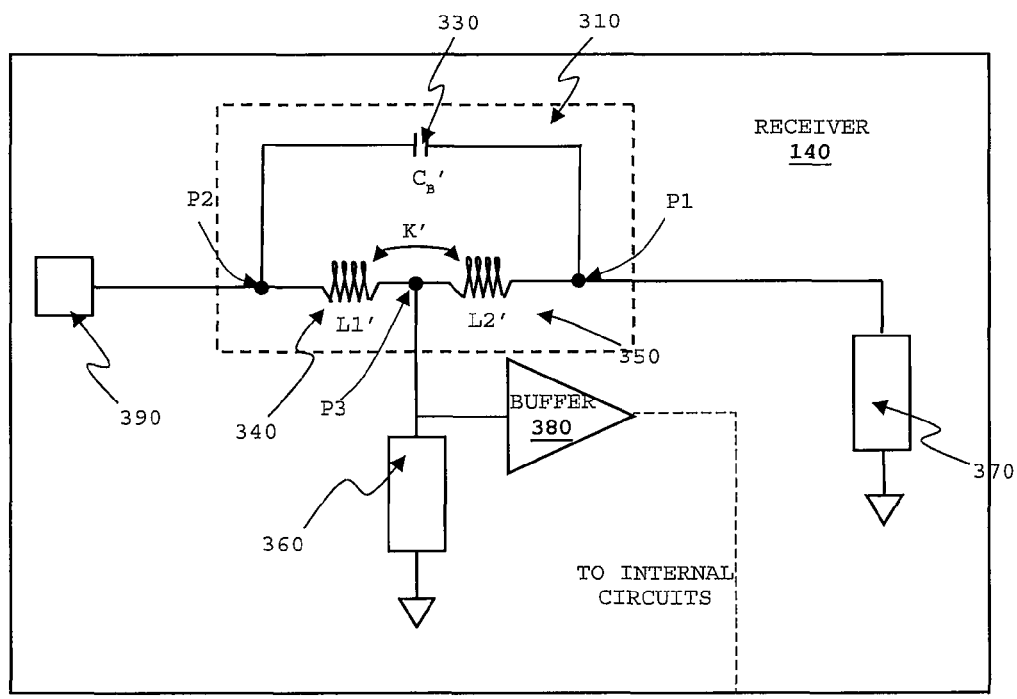
FIG. 3 shows an illustrative receiver circuit in accordance with one embodiment of the present invention.

Referring still to FIG. 1, transceiver 120 may include transmitter circuit 130 and receiver circuit 140. Transmitter circuit 130 and receiver circuit 140 may be collectively referred to as an input/output (I/O) circuit of transceiver 120. Transmitter circuit 130 may be utilized for transferring signals out of integrated circuit 100 whereas receiver circuit 140 may be utilized for receiving signals at integrated circuit 100. Transmitter circuit 130 and receiver circuit 140 may include an input circuit element, an output circuit element, an electrostatic discharge (ESD) protection element, and the like. In one exemplary embodiment, transmitter circuit 130 may include circuitry as illustrated in FIG. 2 and receiver circuit 140 may include circuitry as illustrated in FIG. 3. It should be appreciated that each transceiver 120 may include at least one transmitter circuit 130 and one receiver circuit 140.

Furthermore, transmitter circuit 130 and receiver circuit 140 may include circuit elements, such as matching resistors and T-coil circuits, which may be utilized to match the impedances between different circuits formed in transceiver 120. It should be appreciated that having matching impedances may improve signal transmission in transceiver 120. In one embodiment, the impedance of transmitter circuit 130 and receiver circuit 140 remains constant across a relatively large frequency range (e.g., a range of up to 10 GHz). Hence, transmitter circuit 130 and receiver circuit 140 may further be known as broadband circuits that allow maximum amount of signal power to be transferred across a relatively wide frequency range.

It should be appreciated that when transmitting power through a circuit, it is usually desirable that all of the power (or as much power as possible) will be absorbed by the load circuit (i.e., a targeted destination of a signal) and none of the power (or as little power as possible) will be reflected back to the source circuit (i.e., a location where the power is transmitted from). This may be achieved by making the impedance of the load circuit equal to that of the source circuit.

FIG. 2, meant to be illustrative and not limiting, shows transmitter circuit 130 in accordance with one embodiment of the present invention. Transmitter circuit 130, as described in FIG. 1, may be utilized for transferring signals from an internal circuit (e.g., logic circuitry 110) to an external circuit (e.g., a circuit coupled externally to integrated circuit 100).

In one instance, transmitter circuit 130 may include T-coil circuit 210, ESD protection circuit block 260, resistor 270, buffer circuit 280 and pad 290. Transmitter circuit 130 may further include circuits that are not shown in FIG. 2 (e.g., pull-up and pull-down circuits, level-shifter circuits, etc.). It should be appreciated that even though a specific configuration is shown in FIG. 2, a transmitter circuit may be formed by with circuit configurations.

Buffer circuit 280 may be utilized for isolating any internal circuits that may be coupled to transmitter 130 (e.g., logic circuitry 110 of FIG. 1). In addition to that, buffer circuit 250 may also be utilized to amplify a transmitted signal. Buffer circuit may have a high impedance at input terminal and a low impedance (50 ohm) at the output terminal.

Resistor 270 may be arranged to form a stub circuit element (e.g., a circuit that is coupled between a signal transmission path and a ground terminal). It should be appreciated that a stub circuit element may be utilized for adjusting the impedance of a transmission line (e.g., a coupling means between buffer circuit 280 and T-coil circuit 210). Resistor 270 and T-coil circuit 210 may be utilized for wideband matching between transmitter circuit 130 and external circuitry (connected through pad).

ESD event occurs when there is a sudden voltage/current spike, which may damage the internal circuits of an integrated circuit device (e.g., logic circuitry 110 of FIG. 1). ESD protection circuit block 260 may provide parasitic capacitance to a transmitting signal, which limits the bandwidth of transmitter circuit 130. Pad 290 may be utilized for transferring signals out of integrated circuit 100 of FIG. 1. It should be appreciated that input impedance for pad 290 may have a standard impedance (e.g., 50 Ohms) for maximum power transfer. T-coil circuit 210 may be utilized to provide pure resistive input impedance (i.e., without any reactance component in the impedance) across a wide range of frequency. Furthermore, T-coil circuit 210 may also be utilized to enhance the bandwidth of transmitter circuit 130 by reducing the parasitic capacitance generated by other circuits within transmitter circuit 130.

In FIG. 2, T-coil circuit 210 includes three ports (e.g., ports P1, P2 and P3). Therefore, T-coil circuit 210 may be referred to as a three-port network circuit. It should be appreciated that a three-port network circuit such as T-coil circuit 210 may be utilized for dividing signal power between two transmission pathways or to transmit a signal from one transmission pathway to another transmission pathway. T-coil circuit 210, in the embodiment of FIG. 2, may be utilized for transferring signals from buffer circuit 280 to pad 290 (e.g., an input/output (I/O) pad). T-coil circuit 210 may further route excess voltage/current to ESD protection circuit block 260 when an ESD event occurs.

Still referring to FIG. 2, port P1 of T-coil circuit 210 may be coupled to an output terminal of buffer circuit 280 and a terminal of resistor 270. Accordingly, port P2 of T-coil circuit may be coupled to pad 290 and port P3 may be coupled to ESD protection circuit block 260. In one exemplary embodiment, ports P1, P2 and P3 may have similar impedance values as the respective circuits (e.g., pad 290, ESD protection circuit block 260 and buffer 280) that are coupled to the ports.

In the embodiment of FIG. 2, T-coil circuit 210 may be include capacitor 230, inductor 240 having inductance of 'L1' and inductor 250 having inductance of 'L2'. In one instance, capacitor 230 may be referred to as a bridge capacitor as it provides capacitance between the ports P1 and P2. It should be appreciated that T-coil circuit 210 simplifies the behavior of a T-coil structure (e.g., T-coil 400 of FIG. 4) into circuit elements.

In one embodiment, T-coil circuit 210 has characteristics similar to that of a pure resistive element (e.g., a resistor) across a large frequency range. As such, a signal being transmitted through T-coil circuit 210 having such characteristics may show a good return loss across a large frequency range. For example, when a low frequency signal (e.g., a signal with a frequency at the lower end of a wide frequency band) propagates between buffer circuit 280 and pad 290, the signal may propagate through path 212 (e.g., a path which includes inductor 240 and 250). Alternatively, when a high frequency signal (e.g., a signal with a frequency at the upper end of a wide frequency band) propagates between buffer circuit 280 and pad 290, the signal may propagate through path 211 (e.g., a path which includes capacitor 230). It should be appreciated that when a low frequency signal is transmitted, inductors 240 and 250 may show characteristics similar to a shorted path and when a high frequency signal is transmitted, capacitor 230 may show characteristics similar to a shorted path.

FIG. 3, meant to be illustrative and not limiting, shows a receiver circuit in accordance with one embodiment of the present invention. Receiver circuit 140, as described in FIG. 1, may be utilized to transfer signals received from external circuits that may be coupled to integrated circuit 100 to internal circuits within integrated circuit 100 (e.g., logic circuitry 110 of FIG. 1) of integrated circuit.

Receiver circuit 140 may include T-coil circuit 310, ESD protection circuit block 360, resistor 370, buffer circuit 380 and pad 390 as shown in FIG. 3. ESD protection circuit block 360, resistor 370, buffer circuit 380 and pad 390 may be similar, respectively, to ESD protection circuit block 260, resistor 270, buffer circuit 280 and pad 290 of FIG. 2, and for the sake of brevity, these circuits will not be described in detail again.

T-coil circuit 310, although similar to T-coil circuit 210 of FIG. 2, includes capacitor 330 having capacitance of $C_B'$, inductor 340 having inductance of L1' and inductor 350 having inductance of L2'. The magnetic coupling factor between inductors 340 and 350 and the capacitance of capacitor 330 may be different from the magnetic coupling factor between inductors 240 and 250 and the capacitance of capacitor 230 in T-coil circuit 210 of FIG. 2.

Referring still to FIG. 3, the circuits within receiver circuit 140 are arranged differently than the circuits within transmitter circuit 130 of FIG. 3. For example, buffer circuit 380 is coupled to port P3 of T-coil circuit 310 whereas buffer circuit 280 is coupled to port P1 of T-coil circuit 210. Therefore, T-coil circuit 310 may be configured differently from T-coil circuit 210 of FIG. 2 due to different matching impedance requirements.

Figure 4:
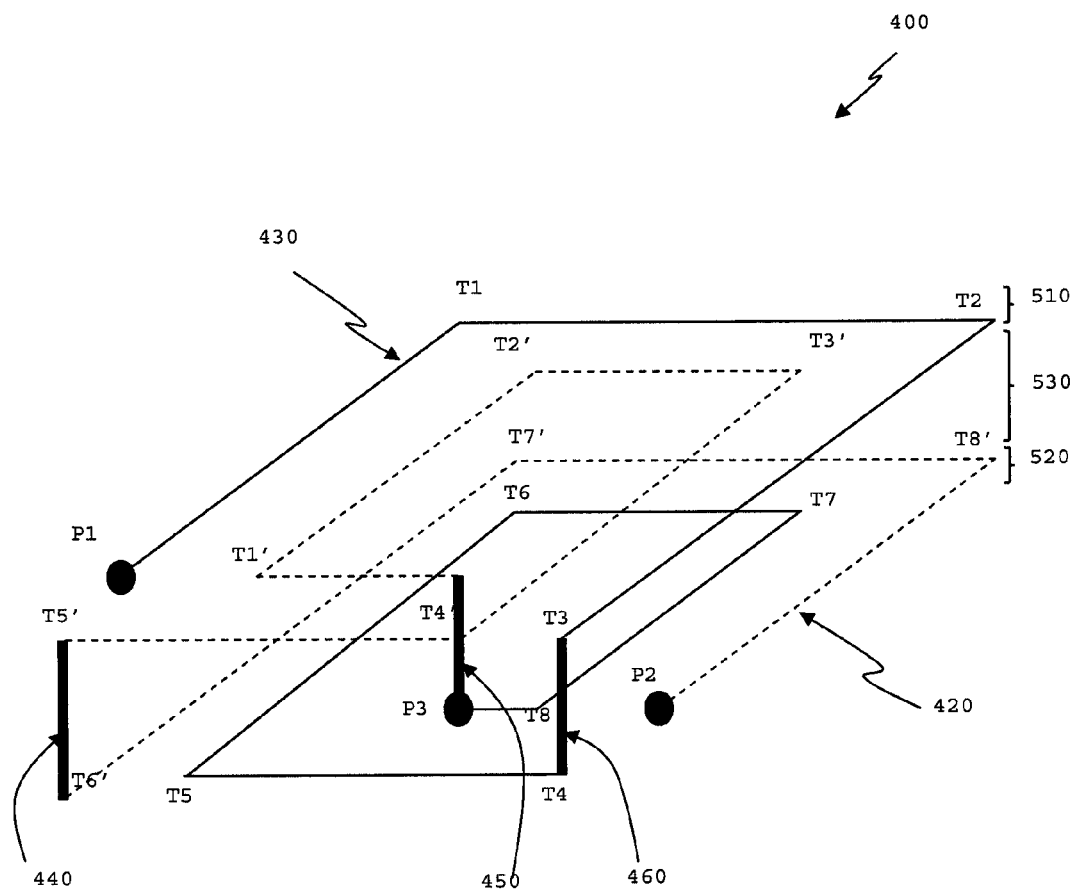
FIG. 4 shows an illustrative interleaved T-coil structure in accordance with one embodiment of the present invention.

FIG. 4, meant to be illustrative and not limiting, illustrates an interleaved T-coil structure in accordance with one embodiment of the present invention. T-coil 400 are formed within two interconnect layers (e.g., interconnect layers 510 and 520) of an integrated circuit. Interconnect layers 510 and 520 may include metal interconnects, which may be referred to as metal layers in one embodiment. In FIG. 4, interconnect layer 510 may be above interconnect layer 520.

T-coil 400 also includes dielectric layer 530 between interconnect layers 510 and 520. Dielectric layer 530 may include silicon dioxide (SiO2). Interconnect layers 510 and 520 and dielectric layer 530 may be collectively referred to as a dielectric stack. In one embodiment, T-coil 400 may be formed in two or more metal layers of an FPGA device that may include at least ten interconnect layers.

T-coil 400 further includes conductive path 420 (represented by a dashed line) and conductive path 430 (represented by a solid line). A portion of conductive paths 420 and 430 is formed in interconnect layer 510 and another portion of conductive paths 420 and 430 is formed in interconnection layer 520. In addition to that, conductive path 430 surrounds conductive path 420 in interconnect layer 510 and conductive path 420 surrounds conductive path 430 in interconnect layer 520. Conductive path 420 in interconnect layers 510 and 520 forms a helical structure. Similarly, conductive path 430 in interconnect layers 510 and 520 forms another helical structure.

In one embodiment, conductive path 430 may represent inductor 240 of FIG. 2 or inductor 340 of FIG. 3. Similarly, conductive path 420 may represent inductor 250 of FIG. 2 or inductor 350 of FIG. 3. In one instance, conductive paths 420 and 430 are metallic conductive paths that may be used for signal transmission.

In FIG. 4, port one (referred to as 'P1' in FIG. 4) of T-coil 400, at one end of conductive path 430, may be located on interconnect layer 510 and port two (referred to as 'P2') of T-coil 400, at one end of conductive path 420, may be located on interconnect layer 520. Conductive path 430 in interconnect layer 510 may be coupled to conductive path 430 in interconnect layer 520 through via 460. Accordingly, conductive path 420 in interconnect layer 520 may be coupled to conductive path 420 in interconnect layer 510 through via 440. The third port (referred to as 'P3') may be located in interconnect layer 520 where conductive path 430 couples with via 450. The ports P1, P2 and P3 of T-coil 400 may be similar to respective ports P1, P2 and P3 of T-coil circuit 210 of FIG. 2. Therefore, the respective ports P1, P2 and P3 of T-coil 400 may be further coupled to other circuits as shown in transmitter circuit 130 of FIG. 3 or receiver circuit 140 of FIG. 4.

In FIG. 4, conductive paths 420 and 430, together with their respective vias 440 and 460, may each form a helical structure. The helical structure formed by conductive path 420 and via 440 includes eight turns (e.g., T1'-T8') and the helical structure formed by conductive path 430 and via 460 includes another eight turns (e.g., T1-T8). The number of turns for the respective conductive paths 420 and 430 may depend on a plurality of factors, for example, the amount of magnetic coupling required in T-coil 400.

Referring still to FIG. 4, the angle of each turn in conductive paths 420 and 430 is approximately 90 degrees and as such, conductive paths 420 and 430 may be classified as rectangular helical structures. Alternatively, the conductive paths 420 and 430 may include turns with angles greater than 90 degrees (e.g., 120 degrees for a hexagonal helical structure, 135 degrees for an octagonal helical structure). In one instance, each of conductive paths 420 and 430 may also form a circular helical structure (e.g., a helical structure with smooth curves instead of sharp turns).

It should be appreciated that vias, such as vias 440, 450 and 460, may be utilized to couple two different interconnect layers. Generally, a via may be a through-hole via that is filled with conductive material that penetrates through a dielectric layer (e.g., dielectric layer 530).

In FIG. 4, conductive path 430 may surround conductive path 420 in interconnect layer 510. Conversely, conductive path 420 may surround conductive path 420 in interconnect layer 520. Such an arrangement of conductive paths 420 and 430 within interconnect layers 510 and 520 may be referred to as an 'interleaved' arrangement.

Still referring to FIG. 4, conductive path 430 in interconnect layer 510 may be directly above conductive path 420 in interconnect layer 520 and conductive path 420 in interconnect layer 510 may be directly above conductive path 430 in interconnect layer 520. Therefore, a portion of conductive path 430 may overlap with a portion of conductive path 420. The overlapping portions of conductive paths 420 and 430 in different layers may form a capacitive element, which may be represented by capacitor 230 of FIG. 2 or capacitor 330 of FIG. 3.

Figure 6A:
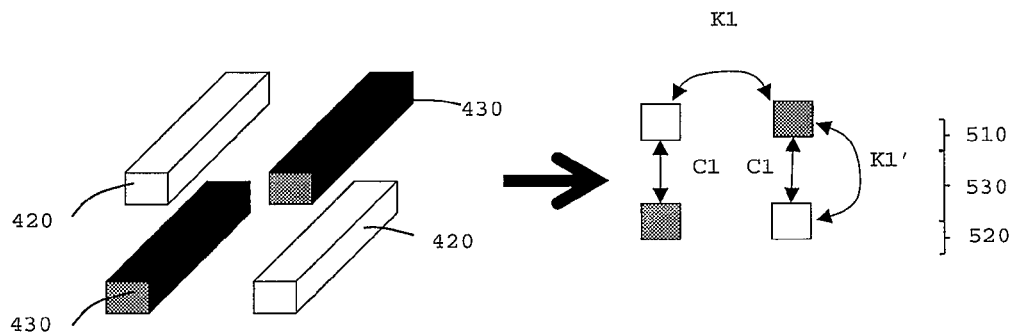
FIGS. 6A-6D show perspective views and cross-sectional views of two conductive paths within a T-coil structure in accordance with one embodiment of the present invention.

In one embodiment, conductive path 420 in interconnect layer 510 is fully overlapping with conductive path 430 in interconnect layer 520 (e.g., similar to the embodiment shown in FIG. 6A). Alternatively, conductive path 420 in interconnect layer 510 is partially overlapping (e.g., at least 25% or 50%) with conductive path 430 in interconnect layer 520 (e.g., similar to the embodiment shown in FIG. 6D). Furthermore, a portion of conductive path 430 may be parallel to a portion of conductive path 420 in the same layer. For example, a portion of conductive path 430 (e.g., the path between turns T1 and T2) is parallel to a portion of conductive path 420 (e.g., the path between turns T2' and T3').

The arrangements of conductive paths 420 and 430 in T-coil 400 may provide magnetic couplings in two directions (e.g., horizontal magnetic coupling and vertical magnetic coupling). It should be appreciated that the horizontal magnetic coupling may be formed between conductive paths 430 and 420 that lie in the same layer whereas the vertical magnetic coupling may be formed between conductive paths 430 and 420 in different layers. An overall magnetic coupling factor (k) of T-coil 400 may be determined by taking into account both magnetic couplings. T-coil 400 with horizontal and vertical magnetic couplings may have a relatively high magnetic coupling factor (k). In one embodiment, the magnetic coupling factor (k) of T-coil 400 may be 0.65.

Figure 5:
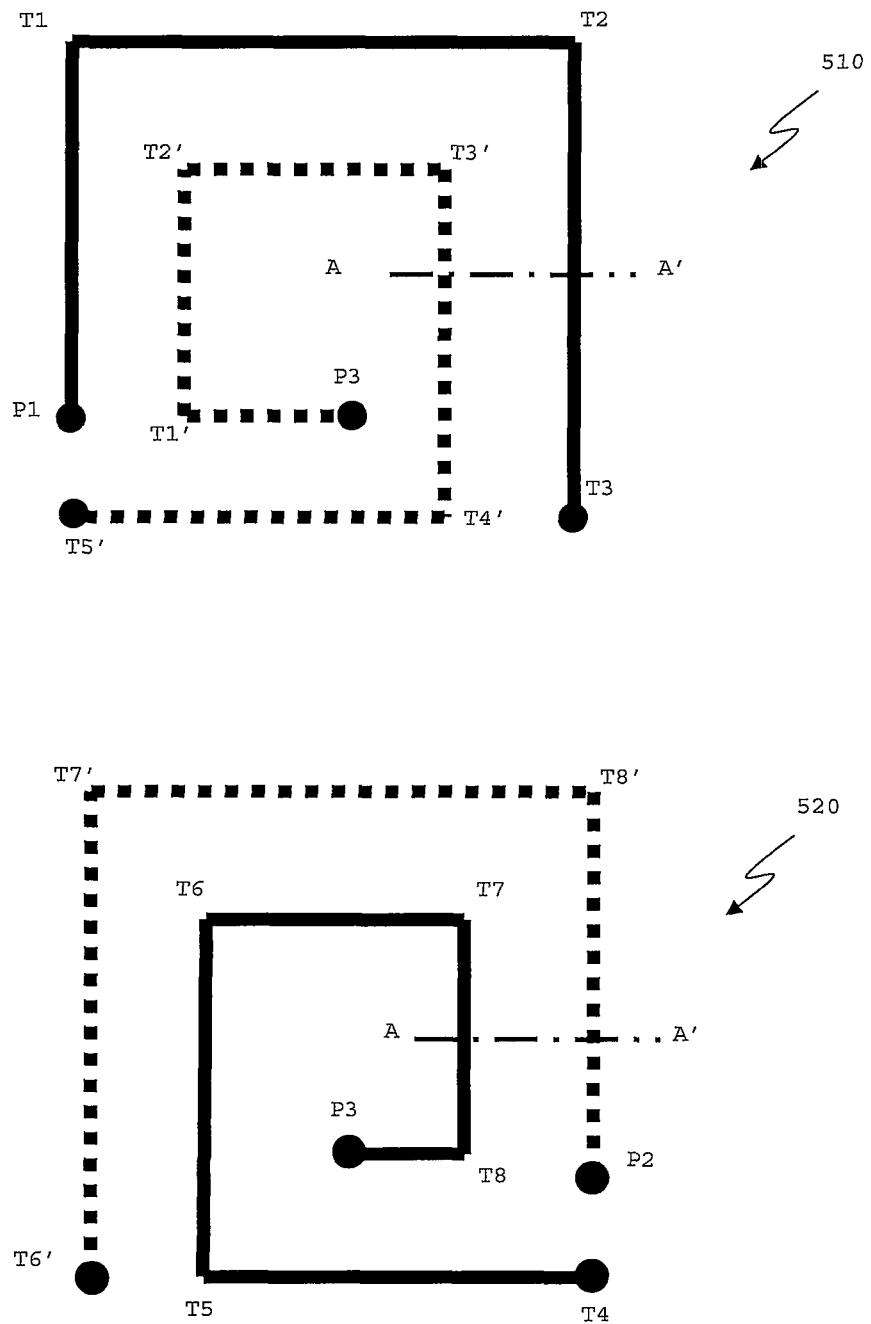
FIG. 5 shows top-down views of the respective upper and lower interconnect layers of a T-coil structure in accordance with one embodiment of the present invention.

FIG. 5, meant to be illustrative and not limiting, shows a top-down view of interconnect layers 510 and 520 of T-coil 400 in accordance with one embodiment of the present invention. Interconnect layers 510 and 520, as described above, may be metal layers that are formed above the silicon substrate of an integrated circuit. In one instance, interconnect layers 510 and 520 may be layers that are directly adjacent to each another.

FIGS. 6A-6D, meant to be illustrative and not limiting, show perspective views and cross-sectional views of conductive paths 420 and 430 at the line A-A' of FIG. 5 in accordance with embodiments of the present invention. Images on the left of respective FIGS. 6A-6D show perspective views of conductive paths 420 and 430 while images on the right of respective FIGS. 6A-6D show cross-sectional views of conductive paths 420 and 430.

FIG. 6A shows conductive paths 420 and 430 with the same path width. Conductive paths 420 and 430 may be horizontally parallel with each other and vertically parallel with each other. The magnetic coupling factor between conductive paths 420 and 430 formed on the same interconnect layer (e.g., either interconnect layer 510 or 520) may be K1 whereas the magnetic coupling factor between conductive paths 420 and 430, each formed on a different interconnect layer, may be K1'. In one embodiment, the magnetic coupling factor K1 may be substantially identical to K1' when the horizontal spacing between conductive paths 420 and 430 (e.g., the spacing between conductive paths 420 and 430 that lie in the same layer) is substantially identical to the vertical spacing between conductive paths 420 and 430 (e.g., the spacing between conductive path 420 in one interconnect layer and conductive path 430 in another interconnect layer). In another embodiment, the values of K1 and K1' may be different when the horizontal spacing between conductive paths 420 and 430 is different from their vertical spacing.

A first pair of conductive paths formed by conductive path 420 in interconnect layer 510 and conductive path 430 in interconnect layer 520 may form a capacitor (i.e., similar to two terminals having a dielectric between the terminals) with a capacitance of C1. Similarly, a second pair of conductive paths formed by conductive path 430 in interconnect layer 510 and conductive path 420 in interconnect layer 520 may form another capacitor that will typically have a similar capacitance value, C1.

Both pairs of conductive paths as described above may provide a substantially identical capacitance value (e.g., C1) because the vertical spacing between each pair of conductive paths is essentially the same.

Figure 6B:
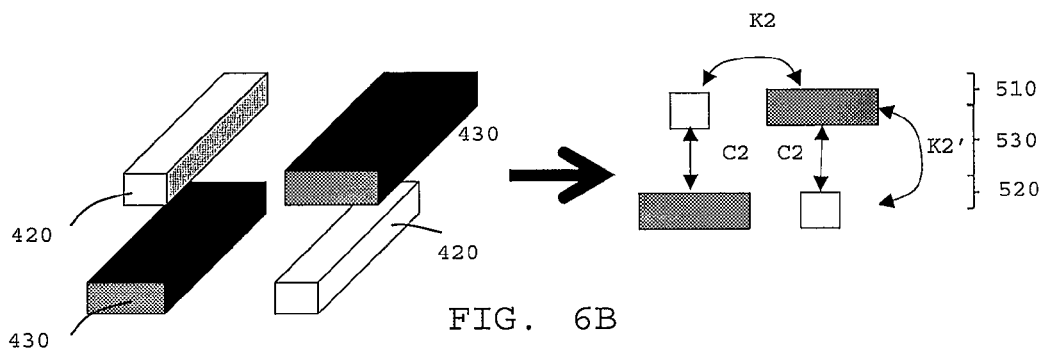

FIG. 6B shows conductive path 430 with a wider width compared to conductive path 420. The horizontal magnetic coupling factor between conductive paths 420 and 430 on the same layer (either interconnect layer 520 or 530) is K2 and the vertical magnetic coupling factor between conductive paths 420 and 430 on different layers is K2'. The magnetic coupling factors K2 and K2' may depend, respectively, on the horizontal and vertical distances between conductive paths 420 and 430. Conductive paths 420 and 430 in different layers may form a capacitor with a capacitance value of C2.

Figure 6C:
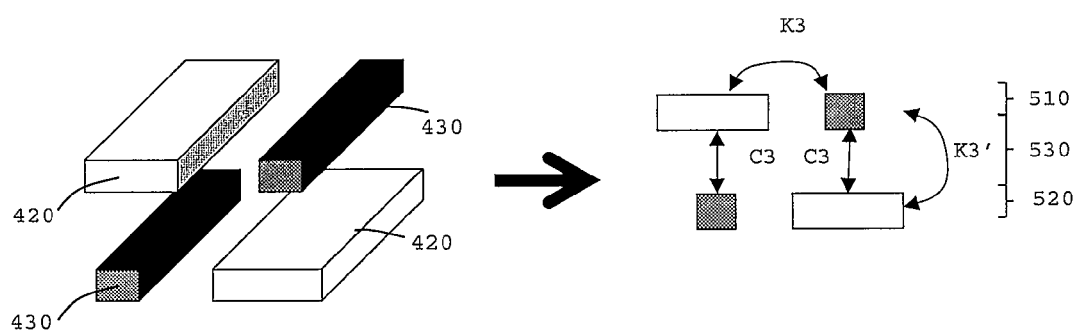

FIG. 6C shows conductive path 420 with a larger width compared to conductive path 430. The horizontal magnetic coupling factor between conductive paths 420 and 430 on the same layer is K3 and the vertical magnetic coupling factor between conductive paths 420 and 430 on different layers is K3'. It should be appreciated that conductive paths 420 and 430 in the different layers may form a capacitor with a capacitance value of C3.

It should be appreciated that the path widths of the conductive paths (e.g., conductive paths 420 and 430) may determine their characteristics impedance. For example, a conductive path may have a relatively small characteristics impedance when the conductive path has a large path width. Different T-coil circuits with different characteristics impedances at the respective ports (port one, port two and port three) may be obtained by adjusting the widths of the conductive paths.

Figure 6D:
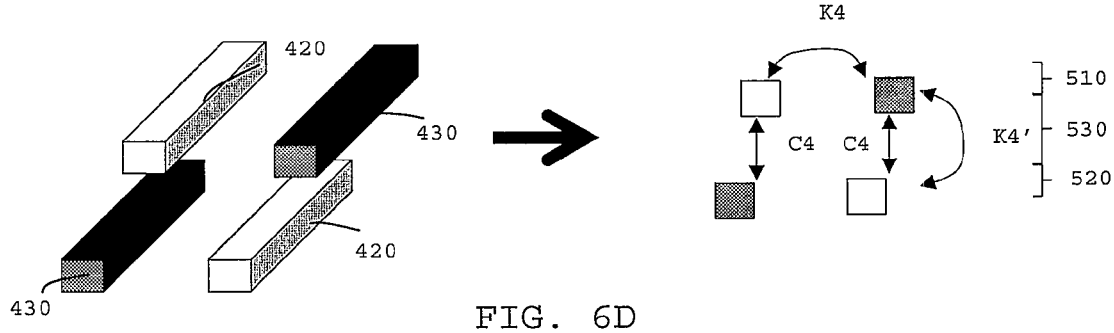

FIG. 6D shows illustrative conductive paths 420 and 430 in accordance with an embodiment of the present invention. Conductive paths 420 and 430 may have a same path width. However, as opposed to the embodiment of FIG. 6A, conductive paths 420 and 430 on interconnect layers 520 and 530 may not be completely aligned with each other. The horizontal magnetic coupling factor between conductive paths 420 and 430 on the same interconnect layer is K4 whereas the vertical magnetic coupling factor between conductive paths 420 and 430 on different interconnect layers is K4'. Conductive paths 420 and 430 in different layers may form a capacitor with a capacitance value of C4.

The vertical magnetic coupling factor between conductive paths 420 and 430 may be directly proportional to the degree of parallelism between the surface areas on both conductive paths 420 and 430. Therefore, as an example, the capacitance value C1 in FIG. 6A may be greater than the capacitance value C4 in FIG. 6D. In one embodiment, the vertical magnetic coupling factor between conductive paths 420 and 430 (both of the same width) that are fully aligned (i.e., high degree of parallelism) with each other (as shown in FIG. 6A) may be 0.65. In other configurations where conductive paths 420 and 430 may not be fully aligned (i.e., low degree of parallelism) with each other, for example, as shown in FIGS. 6B-6C, the vertical magnetic coupling factor may be lower than 0.65.

Figure 7:
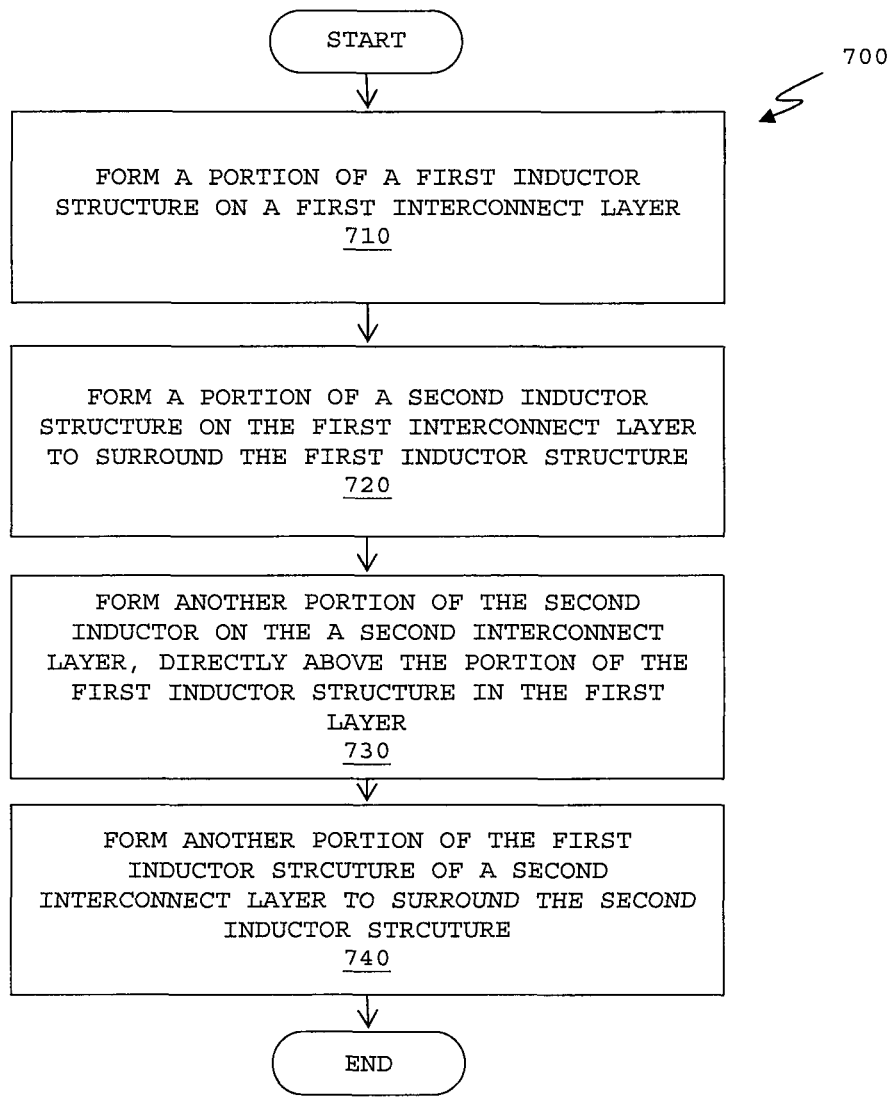
FIG. 7 shows illustrative steps for manufacturing an integrated circuit that includes a T-coil structure in accordance with one embodiment of the present invention.

FIG. 7, meant to be illustrative and not limiting, illustrates a method of manufacturing an integrated circuit that includes a T-coil structure in accordance with one embodiment of the present invention. The T-coil structure, in one instance, may be similar to T-coil 400 of FIG. 4.

Method 700 includes steps that may be a part of a manufacturing process of forming a dielectric stack (e.g., SiO2) above a semiconductor substrate (e.g., silicon). A dielectric stack may include a plurality of interconnect layers (e.g., interconnect layers 510 and 520 of FIG. 4).

At step 710, a portion of a first inductor structure may be formed on the first interconnect layer of the dielectric stack. At step 720, a portion of a second inductor structure may be formed on the first interconnect layer. The second inductor structure may be formed such that it substantially surrounds the first inductor structure. In one embodiment, conductive paths 420 and 430 as shown in interconnect layer 520 of FIG. 5 may be formed upon the completion of step 720. Next, at step 730, another portion of the second inductor structure is formed on a second interconnect layer. This portion of the second inductor structure (formed at step 730) may be formed directly above the portion of the first inductor structure that has been formed in the first interconnect layer.

At step 740, another portion of the first inductor structure may be formed in the second interconnect layer so as to substantially surround the second inductor structure that has been formed in the same interconnect layer. In one embodiment, conductive paths 420 and 430 as shown in interconnect layer 510 of FIG. 5 may be formed upon the completion of step 740. It should be appreciated that before performing step 730, a dielectric layer may be formed between the first and second interconnect layers by depositing a dielectric substance above the first interconnect layer. Furthermore, each of the steps described above (e.g., steps 710-740) may be performed via standard semiconductor processes such as lithography, etching and diffusion.

Upon the completion of step 740, an interleaved T-coil structure similar to T-coil 400 of FIG. 4 may be formed. Similar to T-coil 400 of FIG. 4, the first and second inductor structures may each form a helical structure. In one instance, the helical structure may be either a circular, rectangular, hexagonal or octagonal helical structure.

The T-coil formed structure may be used in a transmitter or receiver circuit (e.g., transmitter circuit 130 of FIG. 2 or receiver circuit 140 of FIG. 3).

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
a substrate;
a dielectric stack on top of the substrate, wherein the dielectric stack includes first and second layers;
a first inductor structure formed in the first and second layers; and
a second inductor structure formed in the first and second layers, wherein a substantial portion of the first inductor structure vertically overlaps with the second inductor structure, and wherein the first and second inductor structures are connected using only three vias.

2. The integrated circuit as defined in claim 1, wherein the first inductor structure includes a first inductance and the second inductor structure includes a second inductance, the first and second inductance are different, and wherein the first and second inductor structures include a magnetic coupling factor derived from vertical and horizontal magnetic coupling.

3. The integrated circuit as defined in claim 1, wherein the first inductor structure includes a first inductance and the second inductor structure includes a second inductance, wherein the first and second inductances are substantially identical, and wherein the first and second inductor structures includes a magnetic coupling factor derived from vertical and horizontal magnetic coupling.

4. The integrated circuit as defined in claim 1, wherein the first and second inductor structures further comprise a bridge capacitor formed between the first and second inductor structures, and wherein the bridge capacitor includes a bridge capacitance value.

5. The integrated circuit as defined in claim 4, wherein the first inductor structure has a first end that serves as a first port for a circuit, wherein the second inductor structure has a first end that serves as a second port for the circuit, wherein the first and second inductors each have a second end that serves as a third port for the circuit, and wherein the first, second and third ports have impedance values that are defined by inductance values of the first and second inductor structures, a magnetic coupling factor, and the bridge capacitance value.

6. The integrated circuit as defined in claim 1, wherein a portion of the first inductor structure in the first layer is substantially parallel to a portion of the second inductor structure in the first layer, and wherein the portion of the first inductor structure in the first layer is substantially overlapping with another portion of the second inductor structure in the second layer.

7. The integrated circuit as defined in claim 6, wherein the portion of the first inductor structure in the first layer and the another portion of the second inductor structure in the second layer are more than 25% overlapping.

8. The integrated circuit as defined in claim 6, wherein the portion of the first inductor structure and the portion of the second inductor structure are arranged to form a helical shape.

9. The integrated circuit as defined in claim 6, wherein the portions of the first and second inductor structures are arranged to form shapes selected from at least one of: a circular shape, a rectangular shape, an octagonal shape, and a hexagonal shape.

10. The integrated circuit as defined in claim 6, wherein the first inductor structure is formed from a first conductive path having a first width, wherein the second inductor structure is formed from a second conductive path having a second width that is different than the first width.

11. An integrated circuit, comprising:
a first inductor structure formed in first and second interconnect layers, wherein the first inductor structure is formed from first conductive paths having a first width; and
a second inductor structure formed in the first and second interconnect layers, wherein the second inductor structure is formed from second conductive paths having a second width that is different than the first width, wherein only first inductor structure surrounds the second inductor structure in the first interconnect layer, and wherein only the second inductor structure surrounds the first inductor structure in the second interconnect layer.

12. The integrated circuit as defined in claim 11, wherein the first and second inductor structures overlap more than 50 percent.

13. The integrated circuit as defined in claim 11, wherein a portion of the first inductor structure that is in the first interconnect layer is substantially parallel to a portion of the second inductor structure in the first interconnect layer and another portion of the second inductor structure in the second interconnect layer.

14. The integrated circuit as defined in claim 11, wherein the first inductor structure is coupled in series with the second inductor structure.

15. A method of manufacturing a circuit structure, comprising:
forming a portion of a first inductor structure in a first interconnect layer;
forming a portion of a second inductor structure that is parallel with the first inductor structure in the first interconnect layer;
forming another portion of the second inductor structure in a second interconnect layer, wherein the portion of the first inductor structure substantially overlaps with the portion of the second inductor structure in the first interconnect layer and with the another portion of the second inductor structure in the second interconnect layer; and
forming another portion of the first inductor structure in the second interconnect layer, wherein the another portion of the first inductor structure substantially overlaps with the portion of the second inductor structure in the first interconnect layer and with the another portion of the second inductor structure in the second interconnect layer, wherein only the first inductor structure surrounds the second inductor structure in the first interconnect layer, and wherein only the second inductor structure surrounds the first inductor structure in the second interconnect layer.

16. The method as defined in claim 15, wherein the portion of the first inductor structure overlaps more than 25 percent with the portion of the second inductor structure in the first interconnect layer and with the another portion of the second inductor structure in the second interconnect layer.

17. The method as defined in claim 15, wherein the first and second inductor structures each include first and second ends, the method further comprising:
coupling a first port of the circuit structure to the first end of the first inductor structure;
coupling a second port of the circuit structure to the first end of the second inductor structure; and coupling a third port of the circuit structure to the second ends of the first and second inductor structures.

18. The method as defined in claim 15, wherein the first and second inductor structures are arranged to form shapes selected from at least one of: a circular shape, a rectangular shape, an octagonal shape, and a hexagonal shape.

* * * * *